United States Patent
Park et al.

(10) Patent No.: US 11,158,386 B2
(45) Date of Patent: Oct. 26, 2021

(54) MEMORY SYSTEM FOR INTERFERENCE COMPENSATION AND OPERATING METHOD THEREOF

(71) Applicants: SK hynix Inc., Gyeonggi-do (KR); Korea Advanced Institute of Science and Technology, Daejeon (KR)

(72) Inventors: Suk Kwang Park, Chungcheongbuk-do (KR); Jaekyun Moon, Daejeon (KR); Minsu Choi, Daejeon (KR)

(73) Assignees: SK hynix Inc., Gyeonggi-do (KR); Korea Advanced Institute of Science and Technology, Daejeon (KR)

( * ) Notice: Subject to any disclaimer, the term of this patent is extended or adjusted under 35 U.S.C. 154(b) by 9 days.

(21) Appl. No.: 16/848,578

(22) Filed: Apr. 14, 2020

(65) Prior Publication Data
US 2020/0327947 A1 Oct. 15, 2020

(30) Foreign Application Priority Data
Apr. 15, 2019 (KR) .......... 10-2019-0043718

(51) Int. Cl.
*G11C 16/26* (2006.01)
*G06F 11/10* (2006.01)
*G11C 16/04* (2006.01)

(52) U.S. Cl.
CPC .......... *G11C 16/26* (2013.01); *G06F 11/1068* (2013.01); *G11C 16/0483* (2013.01)

(58) Field of Classification Search
CPC .. G11C 16/26; G11C 16/0483; G06F 11/1068
See application file for complete search history.

(56) References Cited

U.S. PATENT DOCUMENTS

| 10,607,709 B1 * | 3/2020 | Steiner ............. G11C 16/26 |
| 2010/0257429 A1 * | 10/2010 | Noguchi .......... G11C 16/3418 714/763 |
| 2011/0138114 A1 * | 6/2011 | Yen .................. G11C 16/3418 711/103 |

(Continued)

FOREIGN PATENT DOCUMENTS

| KR | 10-1856136 | 6/2018 |
| KR | 10-2020-0006752 | 1/2020 |

OTHER PUBLICATIONS

Reza Ashrafi et al. "An efficient equalization technique for multi-level cell flash memory storage systems;" IEEE, pp. 1-4, Jun. 29, 2017 (Year: 2017).*

*Primary Examiner* — Guy J Lamarre
(74) *Attorney, Agent, or Firm* — IP & T Group LLP

(57) ABSTRACT

A memory system includes a memory device including a plurality of memory cells, and a controller configured to access the plurality of memory cells. The controller includes a data read block configured to read first data from one or more pages included in first memory cells, determine a target memory cell subject to a compensation based on the first data, and read second data from one or more pages of second memory cells adjacent to the target memory cell, and an equalizer configured to convert the second data into symbol interfering data, check a probability of the first data from a lookup table according to the symbol interfering data, and determine the compensation on the first data based on the probability.

20 Claims, 11 Drawing Sheets

(56) References Cited

U.S. PATENT DOCUMENTS

| | | | |
|---|---|---|---|
| 2012/0172041 A1* | 7/2012 | Krishnamurthy | H04W 36/0058 455/436 |
| 2013/0114517 A1* | 5/2013 | Blankenship | H04L 5/0094 370/329 |
| 2014/0189219 A1* | 7/2014 | Eldredge | G06F 12/0246 711/103 |
| 2017/0154682 A1* | 6/2017 | Moon | G11C 16/08 |
| 2018/0181459 A1* | 6/2018 | Haratsch | G11C 16/34 |
| 2019/0146871 A1* | 5/2019 | Jeong | G06F 12/1009 714/764 |

\* cited by examiner

—— DISTRIBUTION OF WL(N) BEFORE WL(N+1) IS PROGRAMMED
------ DISTRIBUTION OF WL(N) AFTER WL(N+1) IS PROGRAMMED

FIG. 8B

|  | Interfering cell | | | | victim cell's PGM state probability (%) | |
| --- | --- | --- | --- | --- | --- | --- |
|  | IC1 | IC2 | IC3 | ICN | II | III |
|  |  |  |  |  | P1 | P2 |
| Interfering Cell Program State | Erase | Erase | Erase | Erase | 5% | 95% |
|  | ... | ... | ... | ... | ... | ... |
|  | P3 | P3 | P3 | P3 | 95% | 5% |

MEMORY SYSTEM FOR INTERFERENCE COMPENSATION AND OPERATING METHOD THEREOF

CROSS-REFERENCE TO RELATED APPLICATION(S)

This application claims priority under 35 U.S.C. § 119(a) to Korean Patent Application No. 10-2019-0043718, filed on Apr. 15, 2019, the disclosure of which is incorporated herein by reference in its entirety.

BACKGROUND

1. Field

An embodiment of the disclosure generally relates to a memory system, and more particularly, to a memory system capable of reducing errors that occur due to inter-cell interference (ICI) of a memory device, and an operating method of the memory system.

2. Description of the Related Art

Recently, the paradigm for the computer environment has shifted to ubiquitous computing, which allows computer systems to be used anytime and anywhere. As a result, the use of portable electronic devices such as mobile phones, digital cameras, and laptop computers has rapidly increased. In general, such portable electronic devices use a memory system including a memory device, that is, a data storage device. The data storage device is used as a main memory device or an auxiliary memory device of the portable electronic devices.

SUMMARY

An embodiment of the disclosure can provide a memory system for performing an error check and error correction on data read from a victim cell, or a target cell, by using a program state of an interfering cell that affects the victim cell, and an operating method of the memory system.

An embodiment of the disclosure can provide a device and method that determine a compensation value for data, read based on predetermined reference data, by comparing read voltage levels corresponding to program states of an adjacent cell and a victim cell or a target cell, in order to solve the problem in that real-time compensation becomes difficult when a voltage to be compensated for interference that occurs due to a charge stored in the adjacent cell in a process of reading data in a nonvolatile memory cell is calculated, and then a corresponding value for the read data is compensated for so as to compensate for the interference.

According to an embodiment, a memory system may include a memory device including a plurality of memory cells; and a controller configured to access the plurality of memory cells. The controller may include a data read block configured to read first data from one or more pages included in first memory cells, determine a target memory cell subject to a compensation based on the first data, and read second data from one or more pages of second memory cells adjacent to the target memory cell; and an equalizer configured to convert the second data into symbol interfering data, check a probability of the first data from a lookup table according to the symbol interfering data, and determine the compensation on the first data based on the probability.

The data read block may be configured to output the first data by reading one or more pages from the plurality of memory cells based on a single first reference voltage, and read a plurality of soft data, i.e., data reliability determination data, by reading one or more pages from the plurality of memory cells based on a plurality of second and third reference voltages.

The data read block may be configured to determine reliability for the first data corresponding to each of the memory cells by using the plurality of soft data, and extract the target memory cell corresponding to the first data having low reliability.

The first data includes data outputted by performing a hard decision read operation on a selected page of the plurality of memory cells based on the first reference voltage.

The plurality of soft data includes data outputted by performing a soft decision read operation on a selected page of the plurality of memory cells based on the second and third reference voltages having a predetermined voltage difference from the first reference voltage on a basis of the first reference voltage.

The symbol interfering data includes data obtained by converting the second data into a program state type data.

The lookup table includes a data probability (%) of the first memory cell determined according to program state conditions of the second memory cell, by evaluating the amount of interference for the first memory cell according to the program state conditions of the first memory cell included in the memory device and one or more of the second memory cells adjacent to the first memory cell through prior characterization evaluation.

According to program state conditions of the symbol interfering data of the second memory cell in the lookup table, the equalizer is configured to check the probability of the first data of the first memory cell and determine the compensation on the first data by performing a bit flip operation on the first data when the probability of the first data of the first memory cell is less than a predetermined threshold probability. Further, the equalizer may be configured to check the probability of the first data of the first memory cell and determine the compensation on the first data by performing no bit flip operation on the first data when the probability of the first data of the first memory cell is equal to or greater than the predetermined threshold probability.

The one or more pages include a first page including an LSB page and/or a second page including an MSB page.

The memory system may further include an ECC decoder configured to performing an error correction operation on the first data including the first data on which the compensation is determined by the equalizer.

According to an embodiment, an operating method of a memory system that includes a memory device including a plurality of memory cells and a controller configured to access the plurality of memory cells is provided. The operating method may include: reading first data from one or more pages included in first memory cells to determine a target memory cell subject to a compensation based on the first data; reading second data from one or more pages of second memory cells adjacent to the target memory cell to convert the second data into symbol interfering data, and checking a probability of the first data from a lookup table according to the symbol interfering data to determine the compensation on the first data based on the probability.

The reading the first data from one or more pages included in each of the memory cells may include: outputting the first data by reading one or more pages included in each of the memory cells based on a single first reference voltage; outputting a plurality of soft data, i.e., data reliability determination data, by reading one or more pages included in each of the memory cells based on a plurality of second and third reference voltages; determining data reliability for the first data by using the soft data; and extracting the target memory cell corresponding to the first data having low reliability.

The first data may include data outputted by performing a hard decision read operation on a selected page of the plurality of memory cells based on the first reference voltage.

The plurality of soft data may include data outputted by performing a soft decision read operation on a selected page of the plurality of memory cells based on the second and third reference voltages having a predetermined voltage difference from the first reference voltage on a basis of the first reference voltage.

The symbol interfering data may include data obtained by converting the second data into a program state type data.

The lookup table may include a data probability (%) of the first memory cell determined according to program state conditions of the second memory cell, by evaluating the amount of interference for the first memory cell according to the program state conditions of the first memory cell included in the memory device and one or more of the second memory cells adjacent to the first memory cell through prior characterization evaluation.

The checking of the probability of the first data from the lookup table according to the symbol interfering data may include: checking the probability of the first data read from the first memory cell according to program state conditions of the symbol interfering data of the second memory cell in the lookup table; compensating for an error by performing a bit flip operation on the first data when the probability of the first data is less than a predetermined threshold probability; and performing no bit flip operation on the first data when the probability of the first data of the first memory cell is equal to or greater than the predetermined threshold probability.

The one or more pages may include a first page including an LSB page and/or a second page including an MSB page.

The operating method may further include performing an error correction operation on the first data including the first data on which the compensation is determined.

BRIEF DESCRIPTION OF THE DRAWINGS

FIGS. 8A and 8B are diagrams illustrating memory cell distribution and a lookup table according to an embodiment of the disclosure.

DETAILED DESCRIPTION

Figure 1:
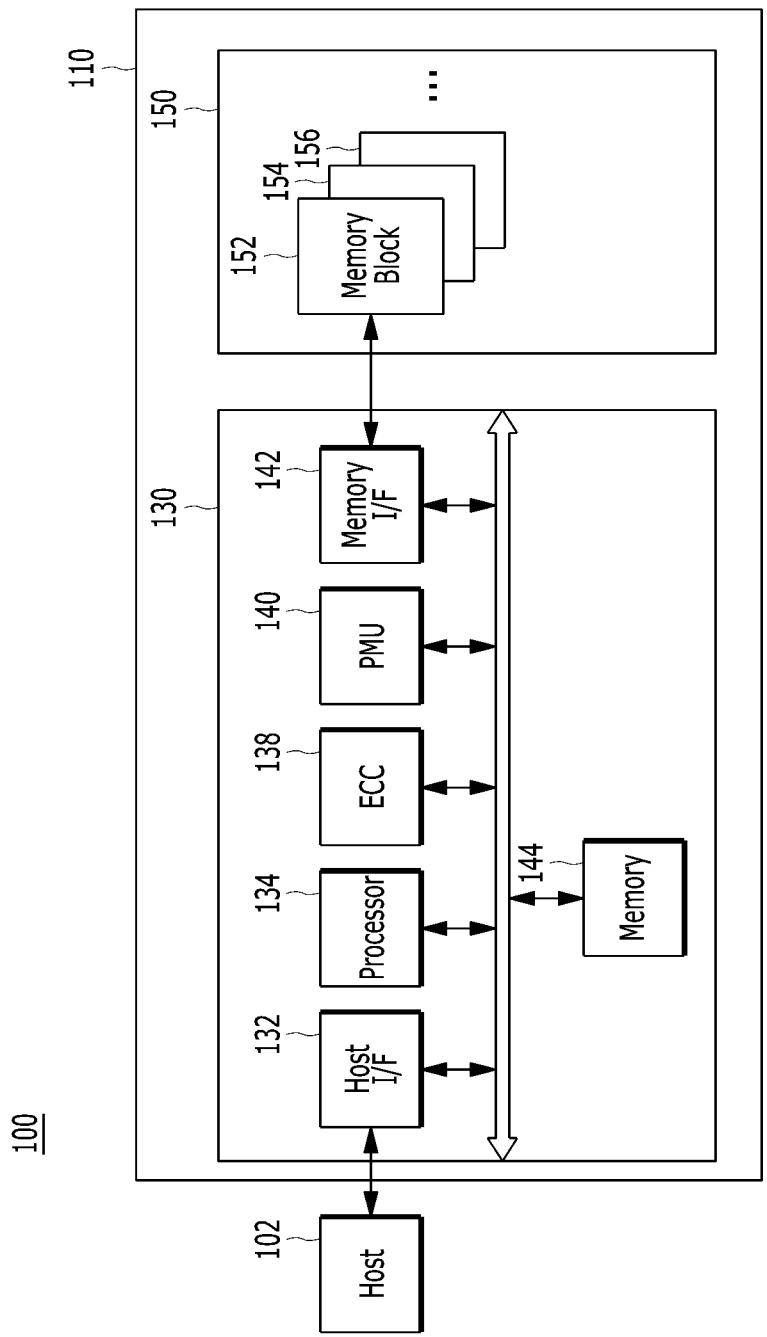
FIG. 1 is a diagram illustrating a data processing system including a memory system according to an embodiment of the disclosure.

Hereinafter, embodiments of the disclosure are described below in more detail with reference to the accompanying drawings. The disclosure may, however, be embodied in various different forms and should not be construed as being limited to the embodiments set forth herein. These embodiments are only provided for making this disclosure thorough and complete and fully conveying the scope of the disclosure to those skilled in the art.

In this disclosure, the terms "comprise," "comprising," "include" and "including" are open-ended. As used in the appended claims, these terms specify the presence of the stated elements and do not preclude the presence or addition of one or more other elements. The terms in a claim does not foreclose the apparatus from including additional components (e.g., an interface unit, circuitry, etc.).

In this disclosure, various units, blocks, circuits or other components may be described or claimed as "configured to" perform a task or tasks. In such contexts, "configured to" is used to connote structure by indicating that the units/circuits/components include structure (e.g., circuitry) that performs those task or tasks during operation. As such, the unit/block/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112, sixth paragraph, for that unit/block/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

As used herein, the terms "first", "second", "third", and so on are used as labels for nouns that they precede, and do not imply any type of ordering (e.g., spatial, temporal, logical, etc.). The terms "first" and "second" do not necessarily imply that the first value must be written before the second value. Further, although these terms may be used herein to identify various elements, these elements are not limited by these terms. These terms are used to distinguish one element from another element that otherwise have the same or similar names. For example, a first circuitry may be distinguished from a second circuitry.

Further, this term "based on" is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

As used in the disclosure, the term 'circuitry' refers to any and all of the following: (a) hardware-only circuit implementations (such as implementations in only analog and/or digital circuitry) and (b) to combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and (c) to circuits, such as a microprocessor(s) or a portion of a microprocessor(s), that require software or firmware for operation, even if the software or firmware is not physically present. This definition of 'circuitry' applies to all uses of this term in this application, including in any claims. As a further example, as used in this application, the term "circuitry" also covers an implementation of merely a processor (or multiple processors) or portion of a processor and its (or their) accompanying software and/or firmware. The term "circuitry" also covers, for example, and if applicable to a particular claim element, an integrated circuit for a storage device.

FIG. 1 illustrates a data processing system including a memory system according to an embodiment of the disclosure. Referring to FIG. 1, the data processing system 100 may include a host 102 engaged or operably coupled with a memory system 110.

The host 102 may include, for example, any of a variety of portable electronic devices, such as a mobile phone, an MP3 player and a laptop computer, or an electronic device such as a desktop computer, a game player, a television (TV), a projector and the like.

The host 102 also includes at least one operating system (OS), which can generally manage, and control, functions and operations performed in the host 102. The OS may provide interoperability between the host 102 engaged with the memory system 110 and the user of the memory system 110. The OS may support functions and operations corresponding to user's requests. By way of example but not limitation, the OS may include a general operating system and a mobile operating system according to mobility of the host 102. The general operating system may be split into a personal operating system and an enterprise operating system according to system requirements or user's environment. The personal operating system, including Windows and Chrome, may be subject to support services for general purposes. The enterprise operating systems may be specialized for securing and supporting high performance, including Windows servers, Linux and Unix. Further, the mobile operating system may include an Android, an iOS and a Windows mobile. The mobile operating system may be subject to support services or functions for mobility (e.g., a power saving function). The host 102 may include a plurality of operating systems. The host 102 may execute multiple operating systems in cooperation with the memory system 110, corresponding to a user's request. The host 102 may transmit a plurality of commands corresponding to the user's requests into the memory system 110, thereby performing operations corresponding to commands within the memory system 110.

The memory system 110 may perform a specific function or operation in response to a request from the host 102 and, particularly, may store data to be accessed by the host 102. The memory system 110 may be used as a main memory system or an auxiliary memory system of the host 102. The memory system 110 may be implemented with any one of various types of storage devices, which may be electrically coupled with the host 102, according to a protocol of a host interface. Non-limiting examples of suitable storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card and a memory stick.

The storage devices for the memory system 110 may be implemented with a volatile memory device, for example, a dynamic random access memory (DRAM) or a static RAM (SRAM), and/or a nonvolatile memory device such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM or ReRAM) or a flash memory.

The memory system 110 may include a controller 130 and a memory device 150. The memory device 150 may store data to be accessed by the host 102. The controller 130 may control storage of data in the memory device 150.

The controller 130 and the memory device 150 may be integrated into a single semiconductor device, which may be included in any of the various types of memory systems as exemplified above.

By way of example but not limitation, the controller 130 and the memory device 150 may be integrated into a single semiconductor device. The controller 130 and memory device 150 may be so integrated to form an SSD for improving operation speed. When the memory system 110 is used as an SSD, the operating speed of the host 102 connected to the memory system 110 can be improved more than that of the host 102 connected with a hard disk. In another embodiment, the controller 130 and the memory device 150 may be integrated into one semiconductor device to form a memory card, such as a PC card (PCMCIA), a compact flash card (CF), a smart media card (e.g., SM, SMC), a memory stick, a multimedia card (e.g., MMC, RS-MMC, MMCmicro), a secure digital (SD) card (e.g., SD, miniSD, microSD, SDHC), or a universal flash memory.

The memory system 110 may be configured as a part of, for example, a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various components configuring a computing system.

The memory device 150 may be a nonvolatile memory device and may retain data stored therein even while electrical power is not supplied. The memory device 150 may store data provided from the host 102 through a write operation, while providing data stored therein to the host 102 through a read operation. The memory device 150 may include a plurality of memory blocks 152, 154, 156, each of which may include a plurality of pages. Each of the plurality of pages may include a plurality of memory cells to which a plurality of word lines (WL) are electrically coupled. The memory device 150 also includes a plurality of memory dies, each of which includes a plurality of planes, each of which includes memory blocks, among the plurality of memory blocks 152, 154, 156. In addition, the memory device 150 may be a non-volatile memory device, for example a flash memory, wherein the flash memory may be a three-dimensional stack structure.

The controller 130 may control overall operations of the memory device 150, such as read, write, program and erase operations. For example, the controller 130 may control the memory device 150 in response to a request from the host 102. The controller 130 may provide the data, read from the memory device 150, with the host 102. The controller 130 may store the data, provided by the host 102, into the memory device 150.

The controller 130 may include a host interface (I/F) 132, a processor 134, an error correction code (ECC) circuitry 138, a power management unit (PMU) 140, a memory interface (I/F) 142 and a memory 144, all operatively coupled via an internal bus.

The host interface 132 may process commands and data provided from the host 102, and may communicate with the host 102 through at least one of various interface protocols, such as universal serial bus (USB), multimedia card (MMC), peripheral component interconnect-express (PCI-e or PCIe), small computer system interface (SCSI), serial-attached SCSI (SAS), serial advanced technology attachment (SATA), parallel advanced technology attachment (PATA), small computer system interface (SCSI), enhanced small disk interface (ESDI) and integrated drive electronics (IDE). According to an embodiment, the host interface 132 is a component for exchanging data with the host 102, which may be implemented through firmware called a host interface layer (HIL).

The ECC circuitry 138 may correct error bits of the data to be processed in (e.g., outputted from) the memory device 150, which may include an ECC encoder and an ECC decoder. Here, the ECC encoder may perform error correction encoding of data to be programmed in the memory device 150 to generate encoded data into which a parity bit is added and store the encoded data in memory device 150. The ECC decoder may detect and correct errors contained in a data read from the memory device 150 when the controller 130 reads the data stored in the memory device 150. In other words, after performing error correction decoding on the data read from the memory device 150, the ECC circuitry 138 may determine whether the error correction decoding has succeeded and output an instruction signal (e.g., a correction success signal or a correction fail signal). The ECC circuitry 138 may use the parity bit which is generated during the ECC encoding process, for correcting the error bit of the read data. When the number of the error bits is greater than or equal to a threshold number of correctable error bits, the ECC circuitry 138 may not correct error bits but instead may output an error correction fail signal indicating failure in correcting the error bits.

The ECC circuitry 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), or a Block coded modulation (BCM). The ECC circuitry 138 may include any and all circuits, modules, systems or devices for performing the error correction operation based on at least one of the above described codes.

The PMU 140 may manage an electrical power provided in the controller 130. For example, the PMU 140 may detect the power-on 312 and the power-off 314 described in FIG. 1. In addition, the PMU 140 may include a power detector.

The memory interface 142 may serve as an interface for handling commands and data transferred between the controller 130 and the memory device 150, to allow the controller 130 to control the memory device 150 in response to a request delivered from the host 102. The memory interface 142 may generate a control signal for the memory device 150 and may process data entered into or outputted from the memory device 150 under the control of the processor 134 in a case when the memory device 150 is a flash memory and, in particular, when the memory device 150 is a NAND flash memory. The memory interface 142 may provide an interface for handling commands and data between the controller 130 and the memory device 150, for example, operations of NAND flash interface, in particular, operations between the controller 130 and the memory device 150. According to an embodiment, the memory interface 142 may be implemented through firmware called a flash interface layer (FIL) as a component for exchanging data with the memory device 150.

The memory 144 may support operations performed by the memory system 110 and the controller 130. The memory 144 may store temporary or transactional data generated or delivered for operations in the memory system 110 and the controller 130. The controller 130 may control the memory device 150 in response to a request from the host 102. The controller 130 may deliver data read from the memory device 150 into the host 102. The controller 130 may store data entered through the host 102 within the memory device 150. The memory 144 may be used to store data required for the controller 130 and the memory device 150 to perform operations such as read operations or program/write operations.

The memory 144 may be implemented with a volatile memory. The memory 144 may be implemented with a static random access memory (SRAM), a dynamic random access memory (DRAM) or both. Although FIG. 1 exemplifies the memory 144 disposed within the controller 130, the invention is not limited to that arrangement. That is, the memory 144 may be within or externally to the controller 130. For instance, the memory 144 may be embodied by an external volatile memory having a memory interface transferring data and/or signals between the memory 144 and the controller 130.

The memory 144 may store data for performing operations such as data writing and data reading requested by the host 102 and/or data transfer between the memory device 150 and the controller 130 for background operations such as garbage collection and wear levelling as described above. According to an embodiment, for supporting operations in the memory system 110, the memory 144 may include a program memory, a data memory, a write buffer/cache, a read buffer/cache, a data buffer/cache and a map buffer/cache.

The processor 134 may be implemented with a microprocessor or a central processing unit (CPU). The memory system 110 may include one or more processors 134. The processor 134 may control the overall operations of the memory system 110. By way of example but not limitation, the processor 134 can control a program operation or a read operation of the memory device 150, in response to a write request or a read request entered from the host 102. According to an embodiment, the processor 134 may use or execute firmware to control the overall operations of the memory system 110. Herein, the firmware may be a flash translation layer (FTL). The FTL may serve as an interface between the host 102 and the memory device 150. The host 102 may transmit requests for write and read operations to the memory device 150 through the FTL.

The FTL may manage operations of address mapping, garbage collection, wear-leveling and so forth. Particularly, the FTL may load, generate, update, or store map data. Therefore, the controller 130 may map a logical address, which is entered from the host 102, with a physical address of the memory device 150 through the map data. The memory device 150 may otherwise function as a general storage device to perform a read or write operation because of the address mapping operation. Also, through the address mapping operation based on the map data, when the controller 130 tries to update data stored in a particular page, the controller 130 may program the updated data on another empty page and may invalidate old data of the particular page (e.g., update a physical address, corresponding to a logical address of the updated data, from the particular page to the newly programmed page) due to a characteristic of a flash memory device. Further, the controller 130 may store map data of the new data into the FTL.

For example, when performing an operation requested from the host 102 in the memory device 150, the controller 130 uses the processor 134. The processor 134 engaged with the memory device 150 may handle instructions or commands corresponding to an inputted command from the host 102. The controller 130 may perform a foreground operation as a command operation, corresponding to an command from the host 102, such as a program operation corresponding to a write command, a read operation corresponding to a read command, an erase/discard operation corresponding to an erase/discard command and a parameter set operation corresponding to a set parameter command or a set feature command with a set command.

For another example, the controller 130 may perform a background operation on the memory device 150 through the processor 134. By way of example but not limitation, the background operation for the memory device 150 includes copying data in a memory block, among the memory blocks 152, 154, 156, and storing such data in another memory block (e.g., a garbage collection (GC) operation).

The background operation may include an operation to move data stored in at least one of the memory blocks 152, 154, 156 in the memory device 150, into at least another of the memory blocks 152, 154, 156 (e.g., a wear leveling (WL) operation). During a background operation, the controller 130 may use the processor 134 for storing the map data stored in the controller 130 to at least one of the memory blocks 152, 154, 156, e.g., a map flush operation. A bad memory block management operation of checking for bad memory blocks among the plurality of memory blocks 152, 154, 156 is another example of a background operation performed by the processor 134.

In the memory system 110, the controller 130 performs a plurality of command operations corresponding to a plurality of commands received from the host 102. For example, when performing a plurality of program operations corresponding to plural program commands, a plurality of read operations corresponding to plural read commands and a plurality of erase operations corresponding to plural erase commands sequentially, randomly or alternatively, the controller 130 may determine which channel(s) or way(s) for connecting the controller 130 to which memory die(s) in the memory 150 is/are proper or appropriate for performing each operation. The controller 130 may send or transmit data or instructions via determined the channel(s) or way(s) for performing each operation. The plurality of memory dies may transmit an operation result via the same channel(s) or way(s), respectively, after each operation is complete. Then, the controller 130 may transmit a response or an acknowledge signal to the host 102. In an embodiment, the controller 130 may check a status of each channel or each way. In response to a command received from the host 102, the controller 130 may select at least one channel or way based on the status of each channel or each way so that instructions and/or operation results with data may be delivered via selected channel(s) or way(s).

By way of example but not limitation, the controller 130 may recognize statuses regarding channels (or ways) associated with memory dies in the memory device 150. The controller 130 may determine each channel or each way as being in a busy state, a ready state, an active state, an idle state, a normal state, or an abnormal state. The controller's determination of which channel or way an instruction (and/or a data) is delivered through can be based on a physical memory block address, e.g., to which die(s) the instruction (and/or the data) is delivered. The controller 130 may refer to descriptors delivered from the memory device 150. The descriptors may include a memory block or a page of parameters that describe informative items about the memory device 150, which is a data with a set format or structure. For instance, the descriptors may include device descriptors, configuration descriptors, unit descriptors, and the like. The controller 130 can refer to, or use, the descriptors to determine with which channel(s) or way(s) an instruction or a data is exchanged.

A management unit (not shown) may be included in the processor 134. The management unit may perform bad memory block management of the memory device 150. The management unit may find bad memory blocks, which are in unsatisfactory condition for further use, as well as perform bad memory block management on the bad memory blocks. When the memory device 150 is a flash memory, for example, a NAND flash memory, a program failure may occur during the write operation, for example, during the program operation, due to characteristics of a NAND logic function. During the bad memory block management, the data of the program-failed memory block or the bad memory block may be programmed into a new memory block. The bad memory blocks may seriously aggravate the utilization efficiency of the memory device 150 having a 3D stack structure and the reliability of the memory system 110. Thus, reliable bad memory block management may enhance or improve performance of the memory system 110.

Figure 2:
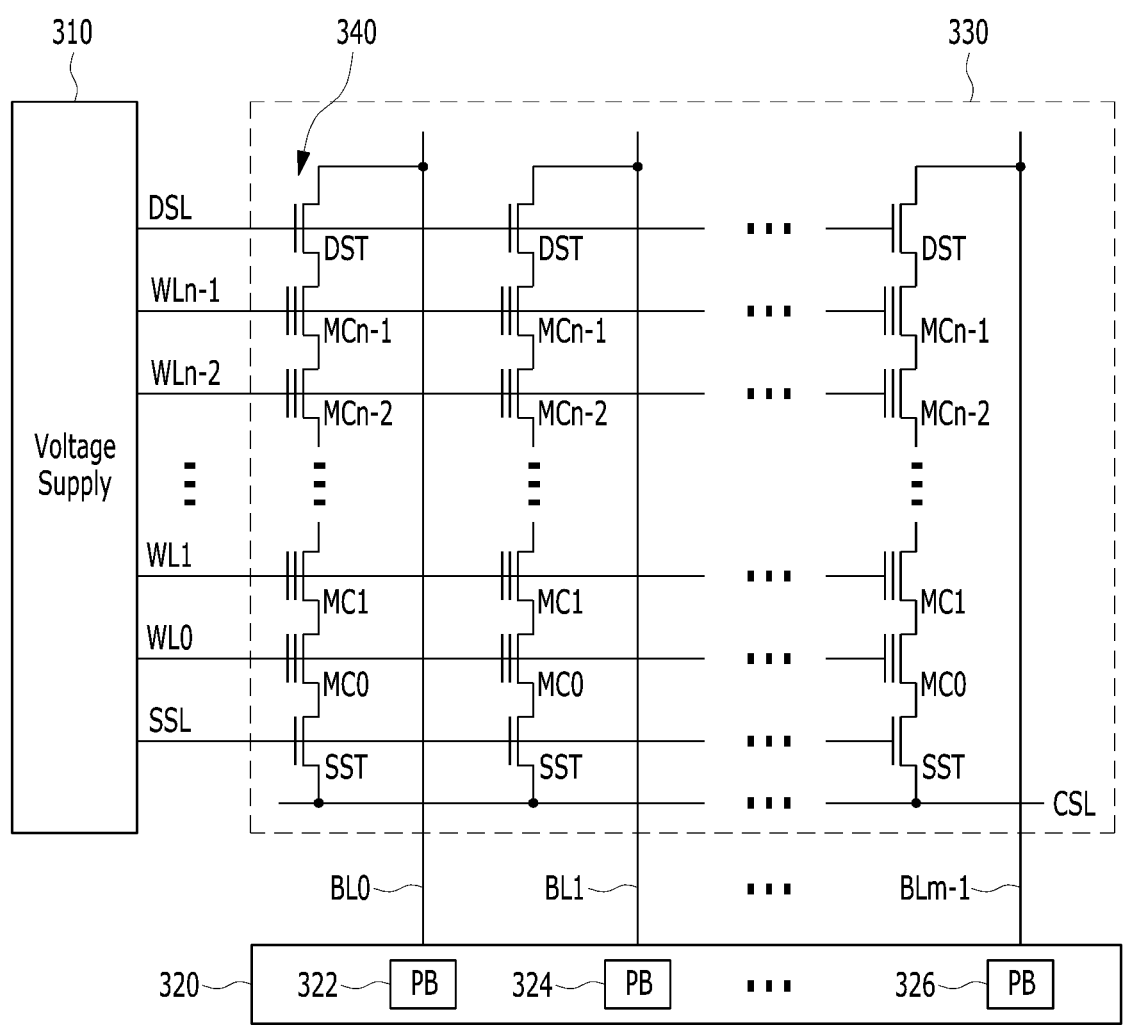
FIG. 2 is a circuit diagram illustrating an exemplary configuration of a memory cell array of a memory block in the memory device according to an embodiment of the disclosure.

FIG. 2 is a circuit diagram illustrating an exemplary configuration of a memory cell array of a memory block in the memory device.

Referring to FIG. 2, memory block 330 is representative of any of memory blocks 152, 154, 156 in the memory device 150 of the memory system 110. Each memory block 330 may include a plurality of cell strings 340 which are realized as a memory cell array and are coupled to bit lines BL0 to BLm−1, respectively. The cell string 340 of each column may include at least one drain select transistor DST and at least one source select transistor SST. A plurality of memory cells or memory cell transistors MC0 to MCn−1 may be coupled in series between the select transistors SST and DST. The respective memory cells MC0 to MCn−1 may be constructed by multi-level cells (MLC) each of which stores data or information of a plurality of bits. The cell strings 340 may be electrically coupled to corresponding bit lines BL0 to BLm−1, respectively.

While FIG. 2 shows, as an example, each memory block 330 constructed by NAND flash memory cells, it is noted that each of the plurality of memory blocks 152,154,156 is not limited to a NAND flash memory and may be realized by a NOR flash memory, a hybrid flash memory in which at least two kinds of memory cells are combined, or a one-NAND flash memory in which a controller is built in a memory chip. The memory device 150 may be realized as not only a flash memory device in which a charge storing layer is constructed by conductive floating gates but also a charge trap flash (CTF) memory device in which a charge storage layer is constructed by a dielectric layer.

A voltage supply circuit 310 of the memory device 150 may provide word line voltages (for example, a program voltage, a read voltage and a pass voltage) to be supplied to respective word lines according to an operation mode and voltages to be supplied to bulks (for example, well regions) formed with memory cells. The voltage generating operation of the voltage supply circuit 310 may be performed by the control of a control circuit (not shown). The voltage supply circuit 310 may generate a plurality of variable read voltages to generate a plurality of read data, select one of the memory blocks (or sectors) of a memory cell array in response to the control of the control circuit, select one of the word lines of the selected memory block, and provide the word line voltages to the selected word line and unselected word lines.

A read/write circuit 320 of the memory device 150 is controlled by a control circuit (not shown), and may operate as a sense amplifier or a write driver according to an operation mode. In a verify/normal read operation, the read/write circuit 320 may operate as a sense amplifier for reading data from the memory cell array. In a program operation, the read/write circuit 320 may operate as a write driver which drives bit lines according to data to be stored in the memory cell array. In the program operation, the read/write circuit 320 may receive data to be written in the memory cell array, from a buffer (not shown), and may drive the bit lines (e.g., supply a predetermined voltage, or a predetermined current, into the bit lines) according to inputted data. To this end, the read/write circuit 320 may include a plurality of page buffers (PB) 322, 324 and 326 respectively corresponding to columns (or bit lines) or pairs of columns (or pairs of bit lines). A plurality of latches (not shown) may be included in each of the page buffers 322, 324 and 326.

Figure 4:
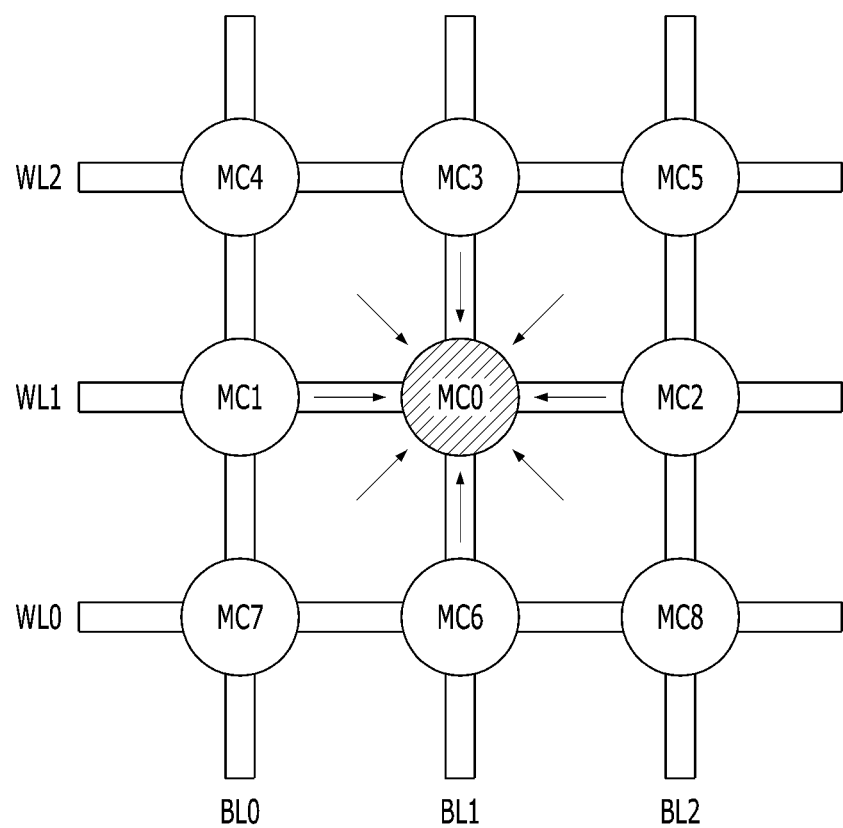
FIG. 4 is a diagram illustrating a cell array of a nonvolatile memory device according to an embodiment of the disclosure.

The memory device 150 may be realized as a 2-dimensional or 3-dimensional memory device. In particular, as shown in FIG. 4, the memory device 150 may be realized as a nonvolatile memory device with a three-dimensional stack structure. In the case where the memory device 150 is realized as a three-dimensional structure, the memory device 150 may include a plurality of memory blocks BLK0 to BLKN−1.

Figure 3A:
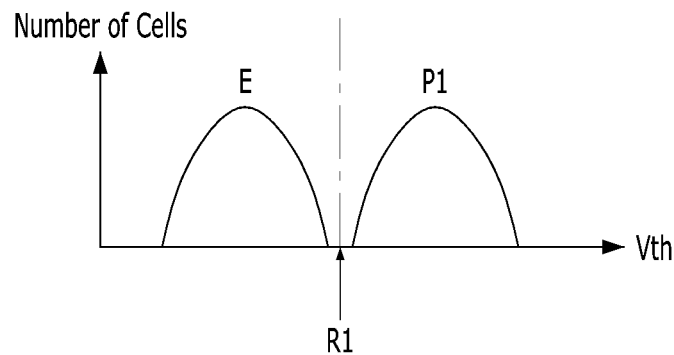
FIGS. 3A to 3C are graphs illustrating threshold voltage distribution of memory cells in the memory device according to an embodiment of the disclosure.
Figure 3B:
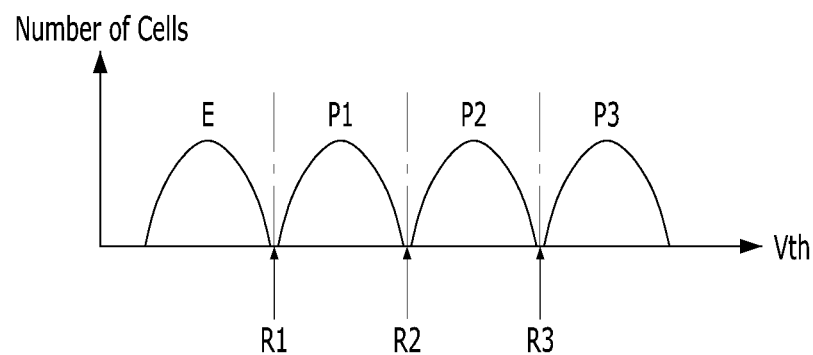
Figure 3C:
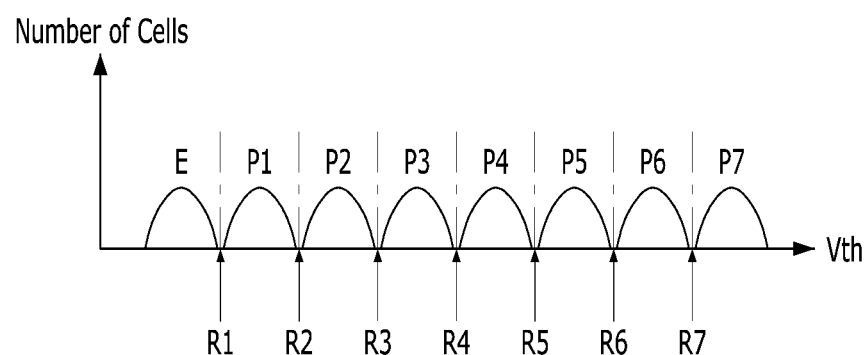

FIGS. 3A to 3C are graphs illustrating threshold voltage distributions of memory cells in the memory device.

Referring to FIGS. 3A to 3C, each horizontal axis represents a threshold voltage Vth, and each vertical axis represents the number of memory cells. The memory cells of the memory device according to the embodiment may be differently configured. The memory cell shown in FIG. 3A works as a single-bit level cell (SLC) programmed with 1-bit data, the memory cell shown in FIG. 3B works as a multi-bit level cells (MLC) programmed with 2-bit data, and the memory cell shown in FIG. 3C works as a triple-bit level cell (TLC) programmed with 3-bit data. However, the memory cell in the memory device according to an embodiment of the disclosure is not limited thereto, and may be programmed with more than 3-bit data.

The memory cells of each memory device may have different program states according to the number of bits stored in the memory cells. As illustrated in FIG. 3A, when the memory cells to which the embodiment is applied correspond to the single-bit level cells programmed with 1 bit, the memory device may have a threshold voltage distribution of the memory cells having a erase state E and a threshold voltage distribution of the memory cells having a first program state P1. As illustrated in FIG. 3B, when the memory cells to which the embodiment is applied correspond to the multi-bit level cells programmed with 2 bits, the memory device may have a threshold voltage distribution of the memory cells having the erase state E and a threshold voltage distribution of the memory cells having the first program state P1, a second program state P2 and a third program state P3. As illustrated in FIG. 3C, when the memory cells to which the embodiment is applied correspond to the triple-bit level cells programmed with 3 bits, the memory device may have a threshold voltage distribution of the memory cells having the erase state E and a threshold voltage distribution of the memory cells having the first to seventh program states P1 to P7. In the embodiment, for convenience in description, it is described that the memory cells are the 2-bit multi-level cells.

When the threshold voltage distribution can be maintained as described in FIGS. 3A to 3C based on the program states of a plurality of memory cells included in the memory device 150, errors may be not present or be decreased in data outputted from the plurality of memory cells. As the high integration of the memory device 150 is achieved, the interval between the memory cells may be narrowed, and due to the narrowed interval, interference caused by a charge stored in an adjacent cell may occur. The interference may be inversely proportional to the interval or distance between the memory cells, and increase based on a fine fabrication process due to the high integration of the memory device 150.

FIG. 4 is a diagram briefly illustrating a cell array of a nonvolatile memory device according to an embodiment.

Referring to FIG. 4, when memory cells adjacent to a specific memory cell are programmed after the specific memory cell is programmed, the specific memory cell may be affected by the adjacent memory cells. The adjacent memory cells affecting the specific memory cell are referred to as interfering cells (IC), the specific memory cell affected by the interfering cells is referred to as a victim cell (VC). For example, a zeroth memory cell MC0 may be the victim cell, and first to eighth memory cells MC1 to MC8 may be the interfering cells. Herein, a threshold voltage of the zeroth memory cell MC0, which is the victim cell, may be changed by the first to eighth memory cells MC1 to MC8, which are the interfering cells. The undesired change in threshold voltage of the victim cell may be attributed to program disturbance that occurs when a plurality of interfering cells, coupled to the same word line as the victim cell, are programmed and coupling (to be described with reference to FIG. 5) that occurs when a plurality of interfering cells coupled to word lines adjacent to the victim cell are programmed.

Figure 5:
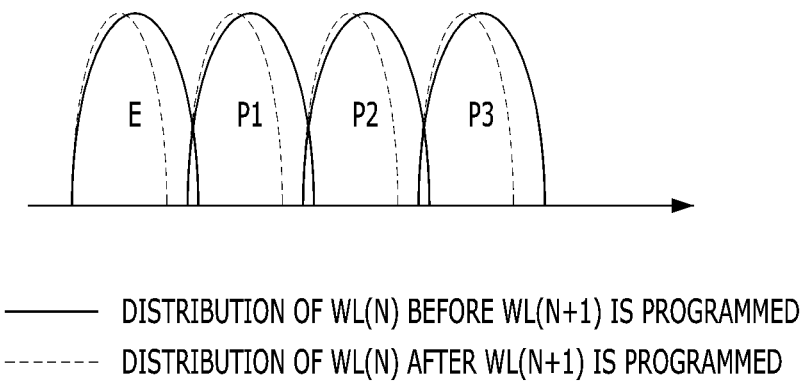
FIG. 5 is a diagram illustrating coupling generated in a nonvolatile memory device according to an embodiment of the disclosure.

Accordingly, during a read operation of the nonvolatile memory device, a read margin may be decreased by the change in threshold voltage described above. As illustrated in FIG. 5, at least some distributions of threshold voltages regarding two neighboring memory cells may overlap with each other. When the distributions of the threshold voltages overlap, interference may occur, and a plurality of error bits may be included in read data. Consequently, reliability is decreased, and a read failure rate is increased. A data recovery read operation may be performed as a method for improving read errors attributable to the coupling between the word lines.

FIG. 5 is a diagram illustrating coupling in a nonvolatile memory device.

Referring to FIG. 5, the coupling may refer to a phenomenon in which a cell distribution is widened because a threshold voltage Vth of an $n^{th}$ word line WLn including a victim cell is also changed as the threshold voltage Vth is changed when an adjacent word line WLn−1 or WLn+1 is programmed after the $n^{th}$ word line WLn is programmed. Herein, the coupling might be not mean that two neighboring word lines, or memory cells coupled to the two neighboring word lines, are connected to each other. The coupling may indicate that at least one memory cell may be electrically or electro-magnetically affected by other memory cells adjacent to the at least one memory cell.

FIG. 5 illustrates the cell distributions of the $n^{th}$ word line WLn before and after the $(n+1)^{th}$ word line WLn+1 is programmed in the nonvolatile memory device. The cell distribution of the $n^{th}$ word line WLn after the $(n+1)^{th}$ word line WLn+1 is programmed is wider than the cell distribution of the $n^{th}$ word line WLn before the $(n+1)^{th}$ word line WLn+1 is programmed, and thus the cell distributions may overlap each other. The reason, as described above, is that when the $(n+1)^{th}$ word line WLn+1 is programmed, the threshold voltage Vth of the $n^{th}$ word line WLn is shifted to the right by the coupling.

As described above, when the cell distributions are changed by the coupling between the word lines, the margin between states decreases, and accordingly, the probability of read errors increases. The data recovery read operation may be performed as a method for improving the read errors due to the coupling between the word lines.

Figure 6:
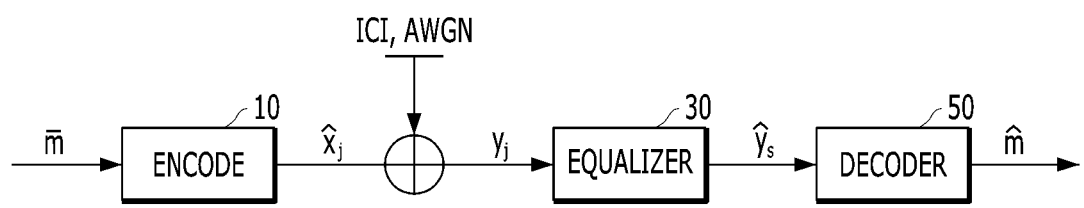
FIG. 6 is a diagram schematically illustrating a data processing operation in a memory system according to an embodiment of the disclosure.

FIG. 6 is a diagram schematically illustrating a data processing operation in a memory system 110 according to an embodiment. FIG. 6 briefly illustrates a basic data processing operation in the memory system 110 for describing the embodiment.

Referring to FIG. 6, a controller 130 may include an encoder 10, an equalizer 30 and a decoder 50.

The encoder 10 generates LSB data $x_{LSB}$ and MSB data $x_{MSB}$, which are encoding data to which parity bits are added by performing error correction encoding on a message $\vec{m}$ received from a host 102, and programs the LSB data $x_{LSB}$ and MSB data $x_{MSB}$ into each memory cell included in a memory device 150. The LSB data $x_{LSB}$ is stored in an LSB page of each memory cell, and the MSB data $x_{MSB}$ is stored in an MSB page of each memory cell. Data stored in the LSB and MSB pages are referred to as source data $x_j$. For convenience in description, the LSB page in which the LSB data $x_{LSB}$ of 2 bits is stored may be defined as a first page, and the MSB page in which the MSB data $x_{MSB}$ of 2 bits is stored may be defined as a second page.

When the controller 130 receives a read request for the source data $x_j$ from the host 102, the controller 130 may read a plurality of first data $y_j$ from any one or more pages of a plurality of memory cells. However, inter-cell interference ICI caused by an interfering cell and additive white Gaussian noise AWGN may be included in the plurality of first data $y_j$. The first data $y_j$ is a signal that is read from a memory device 150 according to a command of the host 102 and transmitted to the equalizer 30 of the controller 130 through a channel. The first data $y_j$ may be represented by the following Equation 1.

$$y_j = x_j + \sum_{i \neq j} f(x_i) + \sum_i n(x_i) \qquad \text{[Equation 1]}$$

Herein, "$x_j$" refers to the source data stored in a memory cell, i.e., a victim cell, included in the memory device 150 according to the command of the host 102. "$x_i$" refers to an input vector of an $i^{th}$ page, and "i" refers to an index of a page. "$f(x_i)$" and "$n(x_i)$" refer to an inter-cell interference ICI channel weight between the victim cell and the interfering cell and an additive white Gaussian noise AWGN vector.

The controller 130 may execute the equalizer 30 and the decoder 50 to remove inter-symbol interference and a predetermined noise from the first data $y_j$.

The equalizer 30 may perform an equalization operation on the plurality of first data $y_j$. The equalizer 30 may remove the inter-cell interference ICI and the predetermined noise from the plurality of first data $y_j$ through the equalization operation. In other words, the equalizer 30 compensates for the interference through a lookup table in which data derived through prior characterization evaluation are stored using program states of data of interfering cells adjacent to the victim cell. In order to perform an error correction operation on a plurality of first data $\hat{y}_s$ on which the interference has been compensated for, the plurality of first data $\hat{y}_s$ are transmitted to the decoder 50.

The decoder 50 performs the error correction operation on the plurality of first data $\hat{y}_s$ on which the interference has been compensated for. The decoder 50 corrects error bits included in the plurality of first data $\hat{y}_s$ on which the interference has been compensated for, restores the first data $\hat{y}_s$ to the source data $x_j$, and then transmits, to the host 102, a message $\hat{m}$ from which the interference has been removed.

The embodiment may relate to a method of correcting an error and removing the interference by determining a probability of the read data $y_j$ of the victim cell according to the program states of the interfering cells, without calculating the amount of interference between the interfering cells and the victim cell. The equalization operation for compensating for the interference will be described in detail with reference to FIGS. 7, 8A and 8B.

Figure 7:
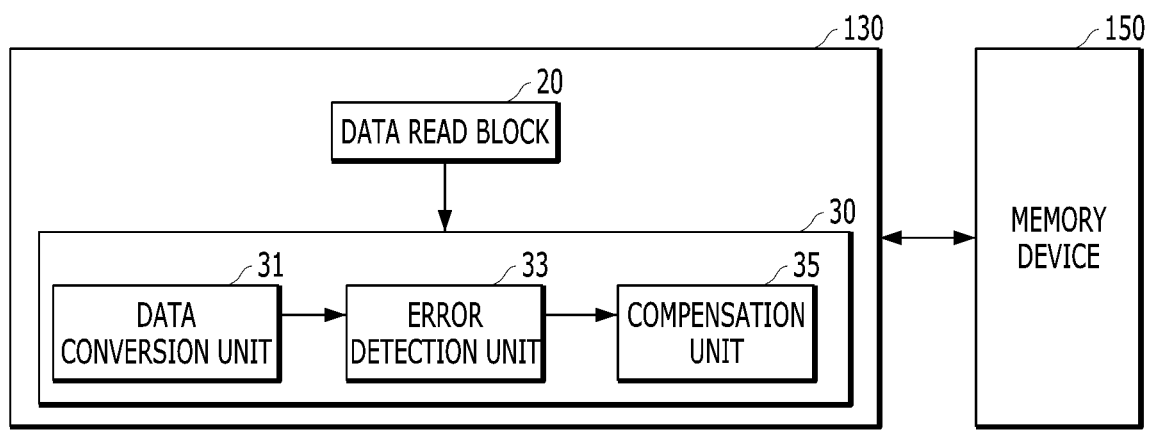
FIG. 7 is a block diagram illustrating a detailed configuration of the memory system illustrated in FIG. 6.
Figure 8A:
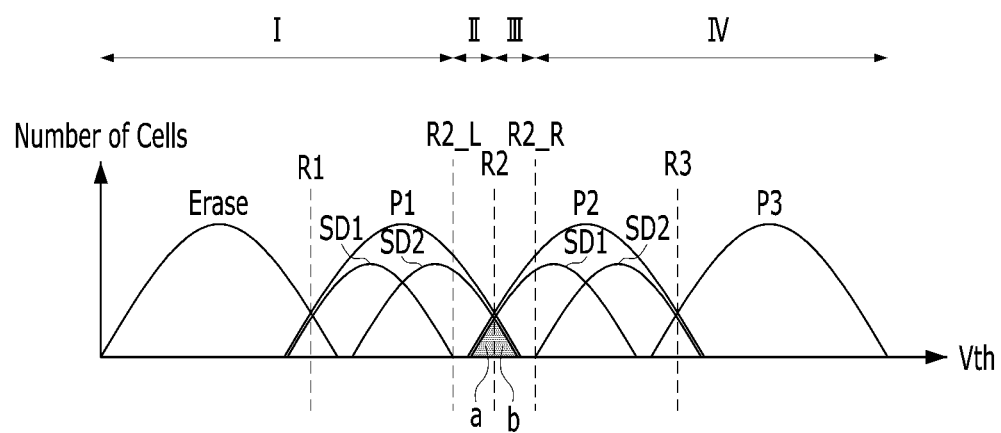

FIG. 7 is a block diagram illustrating a detailed configuration of the memory system 110 illustrated in FIG. 6. FIG. 8A is a diagram illustrating memory cell distributions according to an embodiment. FIG. 8B is a diagram illustrating a lookup table according to an embodiment.

Before describing FIG. 7, when a memory array of the memory device 150 is a multi-level cell (MLC) type, the memory array may include two or more pages. Specifically, memory cells coupled to a single word line included in the memory array may store data of two or more pages. A data read operation and a read data compensation operation of the memory array may be performed on page-by-page basis, or in a unit of page. Thus, each page data may be individually read from the MLC-type memory array. For example, 2-bit data of the memory cell may include the least significant bit (LSB) data and the most significant bit (MSB) data. For example, the LSB data is stored in an LSB page of memory cells MCn, and the MSB data is stored in an MSB page of the memory cells MCn. Although an MLC storing 2-bit data based on 3D NAND is described in the embodiment, the invention is not limited thereto.

Referring to FIG. 7, the memory system 110 may include a controller 130 and a memory device 150. The controller 130 may include a data read block 20, an equalizer 30 and a decoder 50.

The data read block 20 can be configured to read a first page of the memory array based on a predetermined first read voltage R2, and extract first page data $y_{LSB}$. The first page data $y_{LSB}$ is the LSB data composed of a plurality of bits. In addition, the data read block 20 reads the first page of the memory array based on predetermined second and third read voltages R2_L and R2_R, and extracts first page soft data $y_{LSB}^{soft}$. The first page soft data $y_{LSB}^{soft}$ is the soft data composed of bits for determining reliability corresponding to each of the plurality of bits. The data read block 20 can be configured to extract, or determine, a victim cell, included in a region with low reliability, based on the first page soft data $y_{LSB}^{soft}$. That is, a method of extracting the victim cell may determine the reliability by using the first page soft data of the plurality of bits included in the first page data $y_{LSB}$. For example, the first page soft data $y_{LSB}^{soft}$ corresponding to any one bit included in the first page data $y_{LSB}$ is checked. When a value of the first page soft data $y_{LSB}^{soft}$ corresponding to any one bit included in the first page data $y_{LSB}$ is "0", it is determined that the reliability is low, and the data read block 20 extracts a corresponding memory cell as the victim cell. On the other hand, when the value of the first page soft data $y_{LSB}^{soft}$ corresponding to any one bit included in the first page data $y_{LSB}$ is "1", it is determined that the reliability is high, and the data read block 20 does not extract a corresponding memory cell as the victim cell. That is, referring to the memory cell distributions, the data read block 20 determines or extracts, as the victim cell, a memory cell, which is located between the first read voltage R2 and the second read voltage R2_L (region II) and between the first read voltage R2 and the third read voltage R2_R (region III).

The data read block 20 can be configured to read first and second pages of a plurality of interfering cells that interfere in the victim cell, and extract, or obtain, first-page and second-page interfering data $y'_{LSB}$ and $y'_{MSB}$. For convenience in description, the first-page and second-page interfering data $y'_{LSB}$ and $y'_{MSB}$ are referred to as interfering data $y'_{LSB}$ and $y'_{MSB}$. Subsequently, the data read block 20 transmits the interfering data $y'_{LSB}$ and $y'_{MSB}$ of the interfering cells to a data conversion unit 31, and transmits the first page data $y_{LSB}$ of the victim cell to an error detection unit 33 and a compensation unit 35.

FIG. 8A illustrates in more detail the memory cell distributions. Referring to FIG. 8A, major distribution of memory cells coupled to a programmed word line may be represented by "E", "P1", "P2" and "P3". The major distribution may show distribution (or statuses) regarding threshold voltage of programmed memory cells without an interference or a coupling. In the case of interfering cell group having a weak coupling effect, the memory cell distribution may be represented by a first sub-distribution SD1 (weak). In other words, the first sub-distribution SD1 refers to the distribution of memory cells, which are not affected or relatively less affected by the coupling due to the interfering cells. For example, the first sub-distribution SD1 is the distribution of memory cells, which are affected by the interfering cells having an erase state. On the other hand, the memory distribution, which is affected by interfering cells having a strong interference effect, may be represented by a second sub-distribution SD2 (strong). In other words, the second sub-distribution SD2 refers to the distribution of memory cells, which are greatly affected by the coupling due to the interfering cells. For example, the second sub-distribution SD2 is the distribution of memory cells, which are affected by the interfering cells having a third program P3 state with a large amount of charges. For convenience in description, the sub-distributions are classified into 2 types depending on an influence of the coupling, but the embodiment is not limited thereto, and the sub-distributions, which may be deformed from the major distribution, may be classified into two or more types depending on the influence, or strength, of the coupling.

The data read block 20 can be configured to perform a hard decision read operation of reading the first page, i.e., the LSB page, of the memory array based on the first read voltage R2. The hard decision read operation is to apply the first read voltage R2 and read data as "1" or "0" based on a status (e.g., on/off) of the memory cell. When the hard decision read operation is performed based on the first read voltage R2, the data read block 20 determines whether the program state is a P1 direction or a P2 direction. When the program state is the P1 direction, the first page data $y_{LSB}$ of the LSB page is "1". When the program state is the P2 direction, the first page data $y_{LSB}$ of the LSB page is "0". When the data read block 20 reads the first page of the memory array, the first page data $y_{LSB}$ stored in the first page of the plurality of memory cells coupled to one word line WL may be outputted.

Subsequently, the data read block 20 performs a soft decision read operation of reading the first page of the memory array based on the second and third read voltages R2_L and R2_R, and reads the first page soft data $y_{LSB}^{soft}$. The soft decision read operation is to apply a plurality of variable read voltages, i.e., soft decision read voltages, having a predetermined voltage difference based on a hard decision read voltage and form information for applying the reliability to the first page data $y_{LSB}$. For example, as illustrated in FIG. 8A, the data read block 20 may output the first page data $y_{LSB}$ by performing the hard decision read operation based on the first read voltage R2, and then perform the soft decision read operation based on the second and third read voltages R2_L and R2_R so as to additionally output the first page soft data $y_{LSB}^{soft}$ having 2 bits. When the soft decision read operation is completely performed, the cell distributions may be divided into 4 regions I, II, III and IV. The respective first page soft data $y_{LSB}^{soft}$ for the regions I, II, III and IV may be represented by "11", "10", "00" and "01". The reliability of the first page data $y_{LSB}$ may be determined based on the first page soft data $y_{LSB}^{soft}$ for the 4 regions I, II, III and IV. For example, it is assumed that the first page data $y_{LSB}$ is "1". The first page soft data $y_{LSB}^{soft}$ of the memory cells, which is present in the region I, represented by "11", and thus the probability that the first page data $y_{LSB}$ is "1" is high, and the data reliability may be very strong. The first page soft data $y_{soft}$ of the memory cells, which is present in the region II, is represented by "10", and thus the probability that the first page data $y_{LSB}$ is "1" is lower than in the region I, and the data reliability may be weak. The first page soft data $y_{soft}$ of the memory cells, which is present in the region III, is represented by "00", and thus the probability that the first page data $y_{LSB}$ is "1" is lower than in the region II, and the data reliability may be very weak. The first page soft data $y_{soft}$ of the memory cells, which is present in the region IV, is represented by "01", and thus the probability that the first page data $y_{LSB}$ is "1" is lower than in the region III, and the data reliability may be the weakest. In other words, the probability that the first page data $y_{LSB}$ is "1" is gradually reduced toward the region IV, and the data reliability may decrease.

On the other hand, it is assumed that the first page data $y_{LSB}$ is "0". A case where the first page data $y_{LSB}$ is "0" is the opposite to a case where the first page data $y_{LSB}$ is "1". The first page soft data $y_{soft}$ of the memory cells, which is present in the region IV, is represented by "01", and thus the probability that the first page data $y_{LSB}$ is "0" is high, and the data reliability may be very strong. The first page soft data $y_{soft}$ of the memory cells, which is present in the region III, is represented by "00", and thus the probability that the first page data $y_{LSB}$ is "0" is lower than in the region IV, and the data reliability may be weak. The first page soft data $y_{soft}$ of the memory cells, which is present in the region II, is represented by "10", and thus the probability that the first page data $y_{LSB}$ is "0" is lower than in the region III, and the data reliability may become too weak. The first page soft data of the memory cells, which is present in the region I, is represented by "11", and thus the probability that the first page data is "0" is lower than in the region II, and the data reliability may be the weakest. In other words, the probability that the first page data $y_{LSB}$ is "0" is gradually reduced toward the region I, and the data reliability decreases. Accordingly, a case where the first page soft data $y_{soft}$ is represented by "10" may be a region where an error can occur when the first page data $y_{LSB}$ is "0", and a case where the first page soft data $y_{soft}$ is represented by "00" may be a region where an error can occur when the first page data $y_{LSB}$ is "1". Consequently, it may be determined that the first page data $y_{LSB}$ read from a plurality of memory cells, which are present in the regions II and III with low reliability, has a high possibility of errors.

Referring back to FIG. 7, the data read block 20 can be configured to extract the victim cell from the memory cells present in the regions II and III with low reliability. In other words, referring to FIG. 8A, the data read block 20 may extract the victim cell present in the region II, which is between the first and second read voltages R2 and R2_L, and the region III, which is between the first and third read voltages R2 and R2_R, in the major distribution. When the victim cell located in the region II is extracted, the region II is the region with a low probability that the first page data $y_{LSB}$ is "0", and thus the source data of the first page data $y_{LSB}$ may be "1". When the victim cell located in the region III is extracted, the region III is the region with a low probability that the first page data $y_{LSB}$ is "1", and thus the source data of the first page data $y_{LSB}$ may be "0". For understanding of the embodiment, it is described as an example that a victim cell located in an "a" region of the region II is extracted, the victim cell being the cell which should be located in a second program state P2 distribution, that is, on the right side on a basis of R2, but is located on the left side of R2 and becomes error data. In the first sub-distribution in the second program state P2, that is, when all the program states of the interfering cells are "Erase", it may be checked that the source data of the first page data $y_{LSB}$ for the victim cell located in the "a" region was "0", but the first page data $y_{LSB}$ is changed to "1" by the interfering cells. In order to determine compensation on the first page data $y_{LSB}$ of the victim cell located in the "a" region, the data read block 20 reads first and second pages of the interfering cells that interfere in the extracted victim cell, and extracts the first-page and second-page interfering data $y'_{LSB}$ and $y'_{LSB}$. Herein, when the number of interfering cells causing interference in the victim cell is one, the data read block 20 reads two MSB/LSB pages including the corresponding interfering cell, and when the number of interfering cells causing interference in the data of the victim cell is two, the data read block 20 reads the MSB/LSB pages of each of the interfering cells by two pages, and thus reads a total of four pages. For example, when the number of interfering cells that interfere in the victim cell extracted from the region II is four, the data read block 20 reads a total of eight pages. For convenience in description, the first-page and second-page interfering data $y'_{LSB}$ and $y'_{MSB}$ are referred to as interfering data $y'_{LSB}$ and $y'_{MSB}$. The data read block 20 transmits the interfering data $y'_{LSB}$ and $y'_{MSB}$ of the interfering cells to the data conversion unit 31. In addition, the data read block 20 transmits the first page data $y_{LSB}$ of the victim cell to the error detection unit 33.

The equalizer 30 may include the data conversion unit 31, the error detection unit 33, the compensation unit 35 and a second data conversion unit 37.

The data conversion unit 31 can be configured to receive the interfering data $y'_{LSB}$ and $y'_{MSB}$ of the interfering cells from the data read block 20. The data conversion unit 31 can be configured to convert the interfering data $y'_{LSB}$ and $y'_{MSB}$ of the interfering cells into symbol interfering data $y'_s$ having program states. The reason why the data conversion unit 31 converts the interfering data $y'_{LSB}$ and $y'_{MSB}$ into the symbol interfering data $y'_s$ is to check whether an error occurs in the victim cell on a basis of the program states of the interfering cells. Since the MLC NAND flash memory has four program states, e.g., Erase, P1, P2 and P3, each of the symbol interfering data $y'_s$ may be converted into one of the four program states Erase, P1, P2 and P3. For example, when the number of interfering cells that interfere in the victim cell is four, the data conversion unit 31 may convert the interfering data $y'_{LSB}$ and $y'_{MSB}$ into four symbol interfering data Referring to FIG. 8A, it may be seen that all the program states of the interfering cells that interfere in the victim cell extracted from the "a" region are the erase states. The data conversion unit 31 transmits the converted symbol interfering data $y'_s$ of the interfering cells to the error detection unit 33.

The error detection unit 33 can be configured to receive the first page data $y_{LSB}$ of the victim cell from the data read block 20, and receives the symbol interfering data $y'_s$ of the interfering cells from the data conversion unit 31. In addition, the error detection unit 33 can be configured to determine whether the first page data $y_{LSB}$ included in the region II is changed by the interfering cells, using the symbol interfering data $y'_s$. In other words, the error detection unit 33 checks whether an error occurs, by searching for a region from which the victim cell is extracted and the symbol interfering data $y'_s$ in the lookup table of FIG. 8B, which is obtained through prior characterization evaluation, and checking the probability that the first page data $y_{LSB}$ is the source data. Referring to FIG. 8B, the lookup table is the table in which the probability (%) for the first page data $y_{LSB}$ of the victim cell according to program state conditions of the interfering cells is stored, by evaluating the amount of interference according to the program state conditions of the victim cell and the interfering cells included in the memory device. Depending on the program states of the interfering cells, the lookup table is the table indicating the probability that the data of the victim cell in the region II or III is included in the distribution having the first program state P1 and the probability that the data of the victim cell in the region II or III is included in the distribution having the second program state P2. Accordingly, the error detection unit 33 may can be configured to check the probability that the first page data $y_{LSB}$ is the source data depending on the program states of the interfering cells, by using the lookup table, which is composed through the prior characterization evaluation, even without calculating the amount of interference between the victim cell and the interfering cells. In other words, the error detection unit 33 may check the probability that the first page data $y_{LSB}$ of the victim cell extracted from the region II can have the program state P1. For example, when the first page data $y_{LSB}$ of the victim cell extracted from the region II is "1", and all the symbol interfering data $y'_s$ of the interfering cells are the erase state E, it may be seen that the probability that the first page data $y_{LSB}$ of the victim cell is actually "1" having the program state P1 is 5%. Since the probability that the first page data $y_{LSB}$ of the victim cell is "1" is low, it is a target for interference compensation. In order to determine the interference compensation on the first page data $y_{LSB}$, the error detection unit 33 can be configured to transmit, to the compensation unit 35, the probability that the first page data $y_{LSB}$ of the victim cell is the source data.

The compensation unit 35 can be configured to receive the first page data $y_{LSB}$ from the data read block 20 and the probability for the first page data $y_{LSB}$ from the error detection unit 33. The compensation unit 35 can be configured to determine whether the probability for the first page data $y_{LSB}$ received from the error detection unit 33 is less than a predetermined threshold probability TH. When the probability for the first page data $y_{LSB}$ is less than the predetermined threshold probability TH, the compensation unit 35 may can be configured to compensate for the first page data $y_{LSB}$ by performing a bit flip operation (switching a bit's value from 1 to 0, or vice versa) on the first page data $y_{LSB}$. In other words, the compensation unit 35 may can be configured to compensate for the first page data $y_{LSB}$ read from the first page included in the victim cell, through the bit flip operation. For example, when the predetermined threshold probability TH is 50%, the probability that the first page data $y_{LSB}$ is "1" is 5%. For this reason, the compensation unit 35 may can be configured to perform the bit flip operation on the first page data $y_{LSB}$ from "1" to "0", and represent by the first page data $\hat{y}_{LSB}$ on which the interference is compensated for. The compensation unit 35 outputs, to the decoder 50, the first page data $\hat{y}_{LSB}$ on which the interference is compensated for.

The decoder 50 can be configured to perform a decoding operation on the first page data $y_{LSB}$ on which the interference is compensated for, which are transmitted from the compensation unit 35. After performing the decoding operation on the first page data $y_{LSB}$ on which the interference is compensated for, the decoder 50 can be configured to transmit, to the host 102, a message $\vec{m}$ in which an error is corrected.

Figure 9:
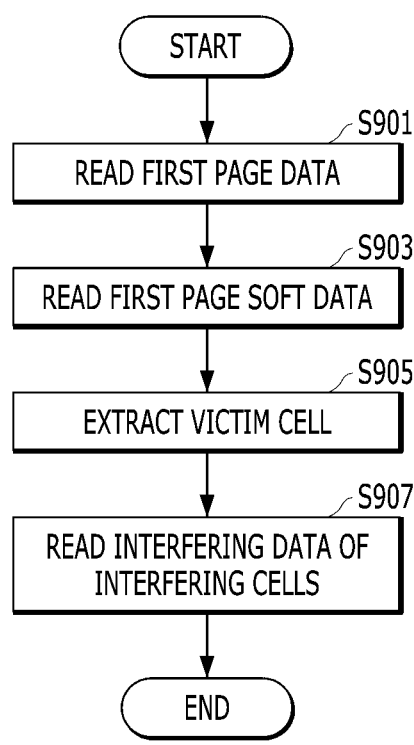
FIG. 9 is a flowchart illustrating a data read operation according to an embodiment of the disclosure.

FIG. 9 is a flowchart illustrating a data read operation according to an embodiment.

In step S901, the controller 130 can be configured to read a first page of the memory array through the predetermined first read voltage R2, and output a plurality of first page data, i.e., a plurality of LSB data $y_{LSB}$.

In step S903, the controller 130 can be configured to read the first page of the memory array based on the predetermined second and third read voltages R2_L and R2_R, and outputs a plurality of first page soft data $y_{LSB}$.

In step S905, the controller 130 can be configured to output a memory cell (hereinafter referred to as a victim cell) included in a region with low reliability, by using the plurality of first page data $y_{LSB}$ and the plurality of first page soft data $y_{LSB}$. The first page data $y_{LSB}$ of the outputted victim cell may be determined as the first page data $y_{LSB}$ having a high probability of errors. Since this was described in detail with reference to FIG. 8A, descriptions thereon are omitted.

In step S907, the controller 130 can be configured to read first and second pages of a plurality of interfering cells that interfere in the victim cell, and extracts the first-page and second-page interfering data $y'_{LSB}$ and $y'_{MSB}$. For convenience in description, the first-page and second-page interfering data $y'_{LSB}$ and $y'_{MSB}$ are referred to as interfering data $y'_{LSB}$ and $y'_{MSB}$.

Figure 10:
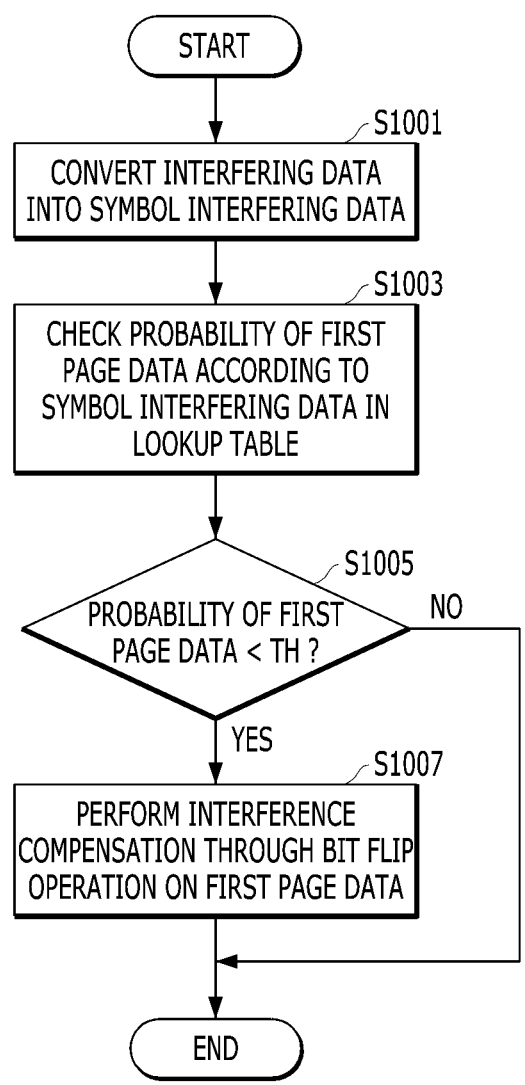
FIG. 10 is a flowchart illustrating an equalization operation according to an embodiment of the disclosure.

FIG. 10 is a flowchart illustrating an equalization operation according to an embodiment.

Referring to FIG. 10, in step S1001, the controller 130 can be configured to convert interfering data $y'_{LSB}$ and $y'_{MSB}$ of the interfering cells into symbol interfering data $y'_s$ having program states. The reason to convert interfering data $y'_{LSB}$ and $y'_{MSB}$ of the interfering cells into the symbol interfering data $y'_s$ is to determine whether to compensate for the victim cell on a basis of the program states of the interfering cells. Since the MLC NAND flash memory has four program states, e.g., P0, P1, P2 and P3, each of the symbol interfering data $y'_s$ may be converted into one of the four program states P0, P1, P2 and P3. For example, when the number of interfering cells that interfere in the victim cell is four, the controller 130 may convert the interfering data $y'_{LSB}$ and $y'_{MSB}$ into four symbol interfering data $y'_s$. Referring to FIG. 8A, it may be seen that all the program states of the interfering cells that interfere in the victim cell extracted from the "a" region are the erase states.

In step S1003, the controller 130 can be configured to check the probability that the first page data $y_{LSB}$ is a source data, according to the symbol interfering data $y'_s$ in the lookup table. In other words, the controller 130 searches for a region in which the victim cell is extracted and the symbol interfering data in the lookup table, which is obtained through prior characterization evaluation, and checks the probability that the first page data $y_{LSB}$ is the source data. Referring to FIG. 8B, the lookup table is the table in which the source data probability (%) for the first page data $y_{LSB}$ of the victim cell according to program state conditions of the interfering cells is stored, after the amount of interference according to the program state conditions of the interfering cells in the periphery of the victim cell included in the memory device is evaluated. The lookup table is the table indicating, depending on the program states of the interfering cells, the probability that the first page data $y_{LSB}$ of the victim cell extracted from the region II has the first program state P1 and the probability that the first page data $y_{LSB}$ of the victim cell extracted from the region III has the second program state P2. For example, when the first page data of the victim cell extracted from the region II is "1", and all the symbol interfering data $y'_z$ of the interfering cells are the erase state E, it may be seen that the probability that the first page data $y_{LSB}$ of the victim cell is "1" is 5%.

In step S1005, the controller 130 can be configured to check whether the probability for the first page data $y_{LSB}$ is less than a predetermined threshold probability TH, and determines interference compensation.

When the probability for the first page data $y_{LSB}$ is is less than the predetermined threshold probability TH (that is, "YES" in step S1005), the controller 130 may compensate for the first page data $y_{LSB}$ by performing a bit flip operation (switching a bit's value from 1 to 0, or vice versa) on the first page data $y_{LSB}$, in step S1007. For example, when the predetermined threshold probability TH is 50%, the probability that the first page data $y_{LSB}$ is "1" is 5%. For this reason, the controller 130 may perform the bit flip operation on the first page data $y_{LSB}$ from "1" to "0".

On the other hand, when the probability for the first page data $y_{LSB}$ is equal to or greater than the predetermined threshold probability TH (that is, "NO" in step S1005), the controller 130 can be configured to determine that an error possibility for the first page data $y_{LSB}$ is low, and thus performs no bit flip operation.

Figure 11:
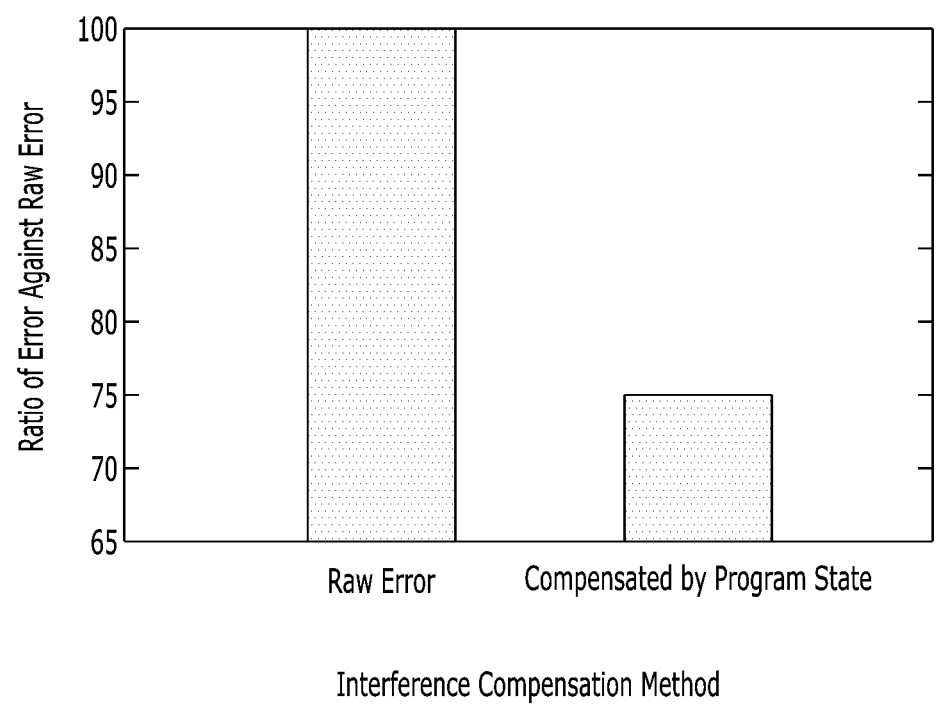
FIG. 11 is a graph illustrating a ratio of error against raw error according to an interference compensation method of a plurality of victim cells according to an embodiment of the disclosure.

FIG. 11 is a graph illustrating a ratio of error against raw error according to an interference compensation method of a plurality of victim cells according to an embodiment.

Referring to FIG. 11, the horizontal axis represents the interference compensation method, and the vertical axis represents the ratio of error against raw error according to the interference compensation method.

First, referring to the ratio of error against raw error before the interference compensation (Raw Error), it may be seen that the ratio of error of the first page data $y_{LSB}$ is 100%.

Subsequently, when the method of compensating for interference on the first page data $y_{LSB}$ of the victim cell by using the program states of the interfering cells is applied (Compensated by Program State), it may be seen that the ratio of error against raw error is reduced to 75%. In other words, it may be seen that the ratio of error against raw error is improved by approximately 25%.

A memory system and an operating method thereof according to embodiments of the disclosure use program states of a victim cell and an interfering cell to check whether there is an error in data read from the victim cell through a pre-set lookup table and to perform an error correction operation, thereby checking whether there is the error in the data of the victim cell and correcting the error even without calculating the amount of interference between the victim cell and the interfering cell.

In addition, the memory system and the operating method thereof according to embodiments of the disclosure use the program states of the victim cell and the interfering cell to check whether there is an error in the data read from the victim cell through the pre-set lookup table and to perform the error correction operation, thereby improving read latency of equalization.

While the disclosure has been described with respect to specific embodiments, it will be apparent to those skilled in the art that various changes and modifications may be made without departing from the scope of the disclosure as defined in the following claims. Therefore, the scope of the disclosure should not be limited to the described embodiments, but should be determined not only by the scope of the following claims but also by the equivalents of the claims.

What is claimed is:

1. A memory system comprising:
a memory device including a plurality of memory cells; and
a controller configured to access the plurality of memory cells,
wherein the controller includes:
a data read block configured to read first data from one or more pages included in first memory cells, determine a target memory cell subject to a compensation based on the first data, and read second data from one or more pages of second memory cells adjacent to the target memory cell; and
an equalizer configured to convert the second data into symbol interfering data, check a probability of the first data from a lookup table according to the symbol interfering data, and determine the compensation on the first data based on the probability.

2. The memory system of claim 1, wherein the data read block is configured to output the first data by reading one or more pages from the plurality of memory cells based on a single first reference voltage, and read a plurality of soft data, i.e., data reliability determination data, by reading one or more pages from the plurality of memory cells based on a plurality of second and third reference voltages.

3. The memory system of claim 2, wherein the data read block is configured to determine reliability for the first data corresponding to each of the memory cells by using the plurality of soft data, and extract the target memory cell corresponding to the first data having low reliability.

4. The memory system of claim 2, wherein the plurality of soft data includes data outputted by performing a soft decision read operation on a selected page of the plurality of memory cells based on the second and third reference voltages having a predetermined voltage difference from the first reference voltage on a basis of the first reference voltage.

5. The memory system of claim 1, wherein the first data includes data outputted by performing a hard decision read operation on a selected page of the plurality of memory cells based on the first reference voltage.

6. The memory system of claim 1, wherein the symbol interfering data includes data obtained by converting the second data into a program state type data.

7. The memory system of claim 1, wherein the lookup table includes a data probability (%) of the first memory cell determined according to program state conditions of the second memory cell, by evaluating the amount of interference for the first memory cell according to the program state conditions of the first memory cell included in the memory device and one or more of the second memory cells adjacent to the first memory cell through prior characterization evaluation.

8. The memory system of claim 1, wherein, according to program state conditions of the symbol interfering data of the second memory cell in the lookup table, the equalizer is configured to check the probability of the first data of the first memory cell and determine the compensation on the first data by performing a bit flip operation on the first data when the probability of the first data of the first memory cell is less than a predetermined threshold probability.

9. The memory system of claim 8, wherein the equalizer is configured to check the probability of the first data of the first memory cell and determine the compensation on the first data by performing no bit flip operation on the first data when the probability of the first data of the first memory cell is equal to or greater than the predetermined threshold probability.

10. The memory system of claim 1, wherein the one or more pages include a first page including an LSB page and/or a second page including an MSB page.

11. The memory system of claim 1, further comprising an ECC decoder configured to perform an error correction operation on the first data including the first data on which the compensation is determined by the equalizer.

12. An operating method of a memory system that comprises a memory device including a plurality of memory cells and a controller configured to access the plurality of memory cells, the operating method comprising:
    reading first data from one or more pages included in first memory cells to determine a target memory cell subject to a compensation based on the first data;
    reading second data from one or more pages of second memory cells adjacent to the target memory cell to convert the second data into symbol interfering data; and
    checking a probability of the first data from a lookup table according to the symbol interfering data to determine the compensation on the first data based on the probability.

13. The operating method of claim 12, wherein the reading the first data from one or more pages included in each of the memory cells includes:
    outputting the first data by reading one or more pages included in each of the memory cells based on a single first reference voltage;
    outputting a plurality of soft data, i.e., data reliability determination data, by reading one or more pages included in each of the memory cells based on a plurality of second and third reference voltages;
    determining data reliability for the first data by using the soft data; and
    extracting the target memory cell corresponding to the first data having low reliability.

14. The operating method of claim 13, wherein the first data includes data outputted by performing a hard decision read operation on a selected page of the plurality of memory cells based on the first reference voltage.

15. The operating method of claim 13, wherein the plurality of soft data includes data outputted by performing a soft decision read operation on a selected page of the plurality of memory cells based on the second and third reference voltages having a predetermined voltage difference from the first reference voltage on a basis of the first reference voltage.

16. The operating method of claim 12, wherein the symbol interfering data includes data obtained by converting the second data into a program state type data.

17. The operating method of claim 12, wherein the lookup table includes a data probability (%) of the first memory cell determined according to program state conditions of the second memory cell, by evaluating the amount of interference for the first memory cell according to the program state conditions of the first memory cell included in the memory device and one or more of the second memory cells adjacent to the first memory cell through prior characterization evaluation.

18. The operating method of claim 12, wherein the checking of the probability of the first data from the lookup table according to the symbol interfering data includes:
    checking the probability of the first data read from the first memory cell according to program state conditions of the symbol interfering data of the second memory cell in the lookup table;
    compensating for an error by performing a bit flip operation on the first data when the probability of the first data is less than a predetermined threshold probability; and
    performing no bit flip operation on the first data when the probability of the first data of the first memory cell is equal to or greater than the predetermined threshold probability.

19. The operating method of claim 12, wherein the one or more pages include a first page including an LSB page and/or a second page including an MSB page.

20. The operating method of claim 12, further comprising performing an error correction operation on the first data including the first data on which the compensation is determined.

* * * * *